(12) United States Patent
Birdeanu et al.

(10) Patent No.: US 11,026,353 B2
(45) Date of Patent: Jun. 1, 2021

(54) ARRANGEMENT HAVING A HOUSING AND A POWER ELECTRONICS CIRCUIT ARRANGED ON A HOUSING BASE IN THE HOUSING

(71) Applicant: VITESCO TECHNOLOGIES GMBH, Hannover (DE)

(72) Inventors: Mircea Birdeanu, Timisoara (RO); Sorin Andrei, Timisoara (RO); Andrei-Radu Negrila, Timisoara (RO); Sebastian Taubert, Timisoara (RO); Eduard Iosif Trif, Timisoara (RO)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 16/449,734

(22) Filed: Jun. 24, 2019

(65) Prior Publication Data
US 2019/0394908 A1    Dec. 26, 2019

(30) Foreign Application Priority Data

Jun. 22, 2018 (EP) ...................................... 18465541
Jul. 5, 2018 (DE) ...................... 10 2018 211 124.3

(51) Int. Cl.
*H05K 7/20* (2006.01)

(52) U.S. Cl.
CPC ..... *H05K 7/20927* (2013.01); *H05K 7/20172* (2013.01); *H05K 7/20263* (2013.01); *H05K 7/20272* (2013.01); *H05K 7/20909* (2013.01)

(58) Field of Classification Search
CPC .......................... H05K 7/20218–20272; H05K 7/20627–20636; H05K 7/20763–20772;
(Continued)

(56) References Cited

U.S. PATENT DOCUMENTS 3,101,599 A * 8/1963 Pippert, Sr. .......... B60H 1/3201
                                                    62/238.3
4,419,716 A   12/1983 Koo
(Continued)

FOREIGN PATENT DOCUMENTS

CN    103794143    *  5/2014
CN    103794143 A    5/2014
(Continued)

OTHER PUBLICATIONS

English Translation of CN 207219278, Zhu et al. ("Zhou"), A Kind of Electrical Equipment and its Radiator Stucture, Apr. 2018 (Year: 2018).*

(Continued)

*Primary Examiner* — Zachary Pape
*Assistant Examiner* — Amir A Jalali
(74) *Attorney, Agent, or Firm* — Laurence A. Greenberg; Werner H. Stemer; Ralph E. Locher

(57) ABSTRACT

An arrangement has a housing and a power electronics circuit arranged on a housing base in the housing. A cavity with connections, which lead to the housing exterior, for supplying and discharging a cooling liquid is formed in the housing base. Cooling coils through which the cooling liquid can flow are formed on that side of the housing base which is averted from the cavity. A fan which is driven by an electric motor is arranged in the housing in such a way that the air flow of the fan is cooled by the cooling coils and then draws heat from the power electronics circuit.

1 Claim, 3 Drawing Sheets

(58) Field of Classification Search
CPC ........... H05K 7/20927; H05K 7/20172; H05K 7/20263; H05K 7/20909; G06F 1/20; H01L 23/473
USPC .............. 361/679.47, 679.53, 699, 701–703; 165/80.4–80.5, 104.33; 257/714
See application file for complete search history.

(56) References Cited

U.S. PATENT DOCUMENTS

| | | | | |
|---|---|---|---|---|
| 5,940,270 | A * | 8/1999 | Puckett | H05K 7/20 361/699 |
| 6,141,217 | A * | 10/2000 | Nakahama | H05K 7/20145 165/104.33 |
| 6,208,512 | B1 * | 3/2001 | Goldowsky | F04D 3/02 165/104.33 |
| 6,438,984 | B1 * | 8/2002 | Novotny | F25D 19/00 257/E23.098 |
| 6,827,131 | B1 * | 12/2004 | Chang | F28D 1/024 165/121 |
| 7,606,027 | B2 * | 10/2009 | Takasou | H05K 7/20154 165/122 |
| 7,821,268 | B2 * | 10/2010 | Albrecht | G01R 33/28 324/318 |
| 2002/0105779 | A1 * | 8/2002 | Lei | G06F 1/20 361/679.49 |
| 2003/0042003 | A1 * | 3/2003 | Novotny | F25D 19/00 165/47 |
| 2004/0114324 | A1 * | 6/2004 | Kusaka | G06F 1/203 361/679.53 |
| 2004/0264127 | A1 * | 12/2004 | Chiu | G06F 1/20 361/679.48 |
| 2006/0118279 | A1 * | 6/2006 | Stafford | F28D 1/024 165/104.33 |
| 2006/0207752 | A1 * | 9/2006 | Chiu | H01L 23/473 165/104.33 |
| 2006/0209512 | A1 * | 9/2006 | Taniguchi | G06F 1/203 361/699 |
| 2006/0262499 | A1 * | 11/2006 | Vinson | F04D 25/166 361/679.48 |
| 2007/0080590 | A1 * | 4/2007 | Vinson | F04D 25/082 310/58 |
| 2007/0133172 | A1 * | 6/2007 | Cheon | G06F 1/20 361/699 |
| 2008/0173427 | A1 * | 7/2008 | Schumacher | H05K 7/20609 165/104.14 |
| 2009/0080173 | A1 * | 3/2009 | Porter | H05K 7/20827 361/831 |
| 2011/0079374 | A1 * | 4/2011 | Horng | G06F 1/20 165/121 |
| 2011/0127027 | A1 * | 6/2011 | Kashirajima | H05K 7/20836 165/286 |
| 2012/0253571 | A1 | 10/2012 | Yun et al. | |
| 2013/0019614 | A1 * | 1/2013 | Campbell | H05K 7/20136 62/62 |
| 2015/0216090 | A1 | 7/2015 | Sakuma et al. | |
| 2015/0282389 | A1 * | 10/2015 | Iyengar | H05K 7/20563 361/679.47 |
| 2016/0011635 | A1 * | 1/2016 | Hayashi | G06F 1/20 361/679.53 |
| 2017/0067672 | A1 * | 3/2017 | Vakiloroaya | F25B 30/02 |
| 2017/0118870 | A1 * | 4/2017 | Yin | H01L 23/34 |
| 2017/0322601 | A1 * | 11/2017 | Coglitore | G06F 1/20 |
| 2018/0098464 | A1 * | 4/2018 | Ishinabe | H05K 7/20272 |
| 2018/0303010 | A1 * | 10/2018 | Kerner | H05K 7/20881 |
| 2018/0328600 | A1 * | 11/2018 | Swanson | F24F 1/022 |
| 2019/0239380 | A1 * | 8/2019 | Guillot | G06F 1/20 |

FOREIGN PATENT DOCUMENTS

| | | |
|---|---|---|
| CN | 107426945 A | 12/2017 |
| CN | 207219278 * | 4/2018 |
| CN | 207219278 U | 4/2018 |
| DE | 102007061593 A1 | 7/2009 |
| EP | 0112994 A2 | 7/1984 |
| EP | 1329145 B1 | 8/2005 |
| JP | H08186388 A | 7/1996 |

OTHER PUBLICATIONS

English Translation of CN 103794142, Zho, Outdoor Display Device, May 2014 (Year: 2014).*

* cited by examiner

ARRANGEMENT HAVING A HOUSING AND A POWER ELECTRONICS CIRCUIT ARRANGED ON A HOUSING BASE IN THE HOUSING

CROSS-REFERENCE TO RELATED APPLICATION

This application claims the priority, under 35 U.S.C. § 119, of European patent application EP 18465541.3, filed Jun. 22, 2018 and German patent application DE 10 2018 211 124.3, filed Jul. 5, 2018; the prior application is herewith incorporated by reference in its entirety.

BACKGROUND OF THE INVENTION

Field of the Invention

U.S. Pat. No. 7,821,268 B1 and its counterpart German published patent application DE 10 2007 061 593 A1 disclose an arrangement comprising a housing and a power electronics circuit which is arranged on a housing base in said housing, in which arrangement a cold distributor on which cooling fins are formed and which has connections, which lead to the housing exterior, for supplying and discharging a cooling liquid is also arranged on this housing base. A fan is formed in the housing. The fan is preferably driven by the coolant flow and the air flow of which fan is cooled by the cooling fins and then draws heat from the power electronics circuit. Individual components of the power electronics circuit can be directly connected to the cold distributor via inflows and outflows in order to be directly cooled by the coolant in this way. However, this is very complicated.

SUMMARY OF THE INVENTION

It is accordingly an object of the invention to provide a housing and a power electronic circuit which overcomes the above-mentioned and other disadvantages of the heretofore-known devices and methods of this general type and to provide a housing and a power electronics circuit which is arranged on a housing base in the housing and which arrangement provides effective cooling of the power electronics circuit in a simpler and flexible manner.

With the foregoing and other objects in view there is provided, in accordance with the invention, an arrangement, comprising:

a housing having a housing base;

a power electronics circuit disposed on the housing base in the housing;

the housing base being formed with a cavity and with connections connecting a housing interior with a housing exterior, for supplying and discharging a cooling liquid;

cooling coils through which the cooling liquid can flow being formed on a side of the housing base that is averted from the cavity; and a fan, to be driven by an electric motor, arranged in the housing and disposed to generate an air flow that cools the cooling coils and thus draws heat from the power electronics circuit.

In other words, the arrangement, or configuration, includes a housing and a power electronics circuit which is arranged on a housing base in the housing, a cavity with connections, which lead to the housing exterior, for supplying and discharging a cooling liquid is formed at least in the housing base. Cooling coils are formed on that side of the housing base which is averted from the cavity. A fan which is driven by an electric motor is arranged in the housing in such a way that the air flow of the fan is cooled by the cooling coils and then draws heat from the power electronics circuit.

The power electronics circuit is therefore arranged on the housing base which functions as a cold distributor and therefore directly cools not only the cooling coils but rather also the components of the power electronics circuit which are arranged on said housing base. The cooling coils are connected to the cavity and the coolant flows through said cooling coils, so that they are cooled more effectively than solely by cooling fins which are cooled by heat transfer. In addition, a fan ensures circulation of air through the cooling coils and to the power electronics circuit. In this case, the fan is driven by an electric motor and is therefore independent of a coolant flow.

In a first variant of the arrangement according to the invention, the electric motor is arranged in the housing. As a result, it is not necessary to guide the drive shaft through a housing wall.

In a second variant of the arrangement according to the invention, the electric motor is arranged outside the housing, as a result of which it is possible to replace the electric motor without having to open the housing.

Here, the electric motor can advantageously be arranged on a housing wall.

Other features which are considered as characteristic for the invention are set forth in the appended claims.

Although the invention is illustrated and described herein as embodied in an arrangement comprising a housing and a power electronics circuit which is arranged on a housing base in said housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
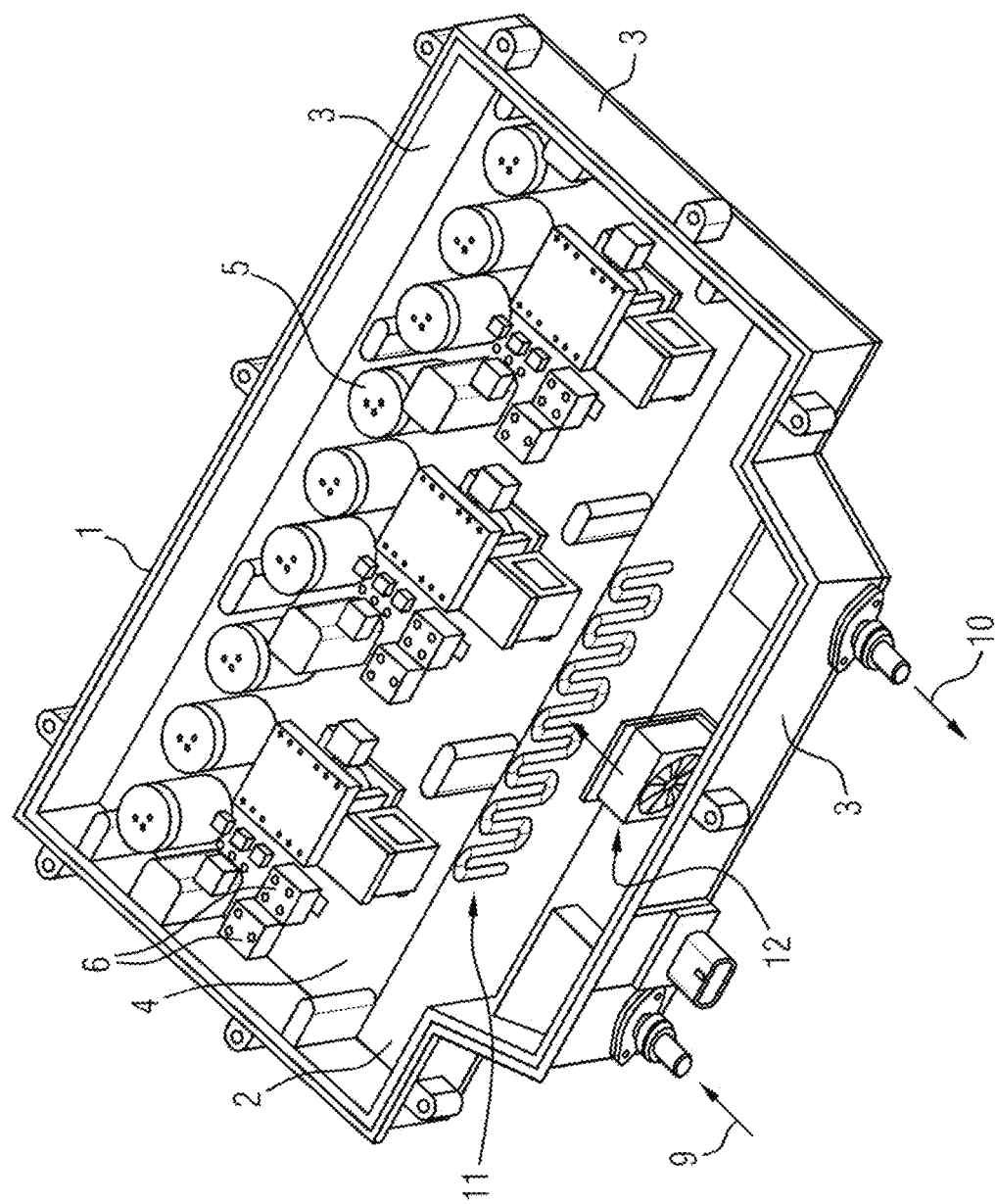
FIG. 1 shows a first exemplary embodiment of an arrangement according to the invention.

Referring now to the figures of the drawing in detail and first, particularly, to FIG. 1 thereof, there is shown a housing 1. The housing 1 is shown in the open state, that is to say without a cover, and has a housing base 2 and housing walls 3. Electrical and electronic components, such as capacitors 5, power semiconductor switching elements 6 and coils 11, are arranged on a printed circuit board 4. This power electronics circuit can be, for example, a charging circuit for conductive or inductive charging of energy stores, for example in a motor vehicle. The printed circuit board 4 is arranged on the housing base 2.

A cavity 8 which is connected to a coolant inlet 9, which leads to the housing exterior, and a coolant outlet 10 is formed in the housing base 2. The housing base 2 and therefore the power electronics circuit which is arranged on it are cooled, or heat is drawn from them, in this way.

Figure 3:
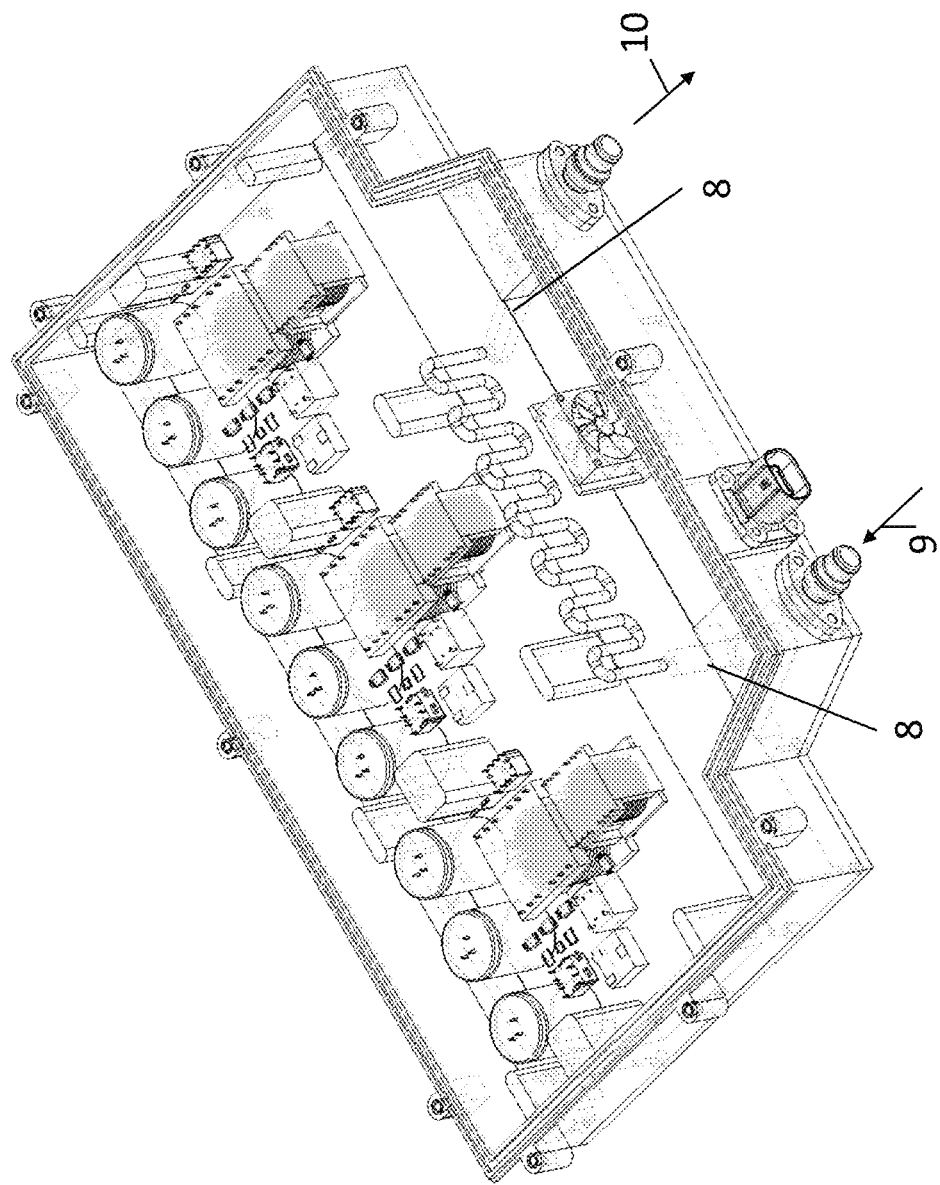
FIG. 3 is a perspective view of the arrangement illustrating a coolant liquid path into, through, and out of the housing.

With reference to FIG. 3, cooling coils 11 which are positioned upright on the housing base 2 and project into the housing 1 in the illustrated exemplary embodiment are arranged above the cavity 8. The cooling coils 11 are undulated so as to maximize the area exposure in the airflow generated by the fan 12. The cooling coils 11 are connected to the cavity 8 in such a way that the coolant flowing into the cavity at 9, flows through said cooling coils 11, and out at 10. In this way the cooling coils are very effectively cooled directly by the coolant and indirectly by heat transfer on account of the mechanical connection to a cavity wall.

In the exemplary embodiment of FIG. 1, the fan 12 is designed with an integrated electric motor, so that the electric motor is also arranged within the housing 1. This has the advantage that no coupling between the drive of the fan 12 and the fan 12 itself and also no passage in a housing wall 3 for a drive shaft are required.

During the operation of the fan 12 with an integrated electric motor, air is guided past the cooling coils 11, which are cooled by the coolant flowing in the cavity and the cooling coils 11, and is blown to the components 5, 6 of the power electronics circuit, so that they are advantageously cooled or heat is drawn from them.

Figure 2:
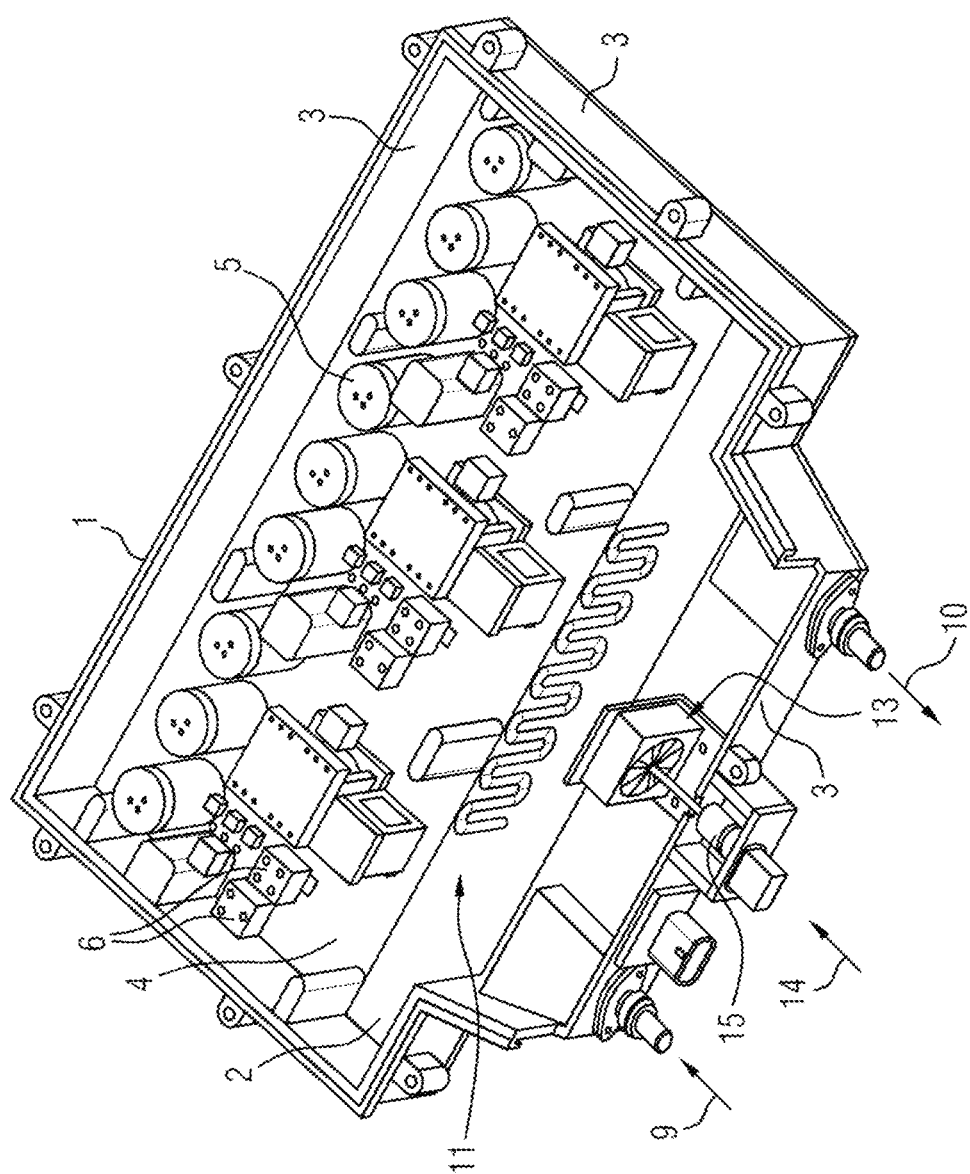
FIG. 2 shows a second variant of an arrangement according to the invention.

The exemplary embodiment, illustrated in FIG. 2, of an arrangement according to the invention comprising a housing and a power electronics circuit which is arranged on a housing base in said housing is of substantially identical design to the variant of FIG. 1, so that identical parts are provided with the same reference symbols and will not be described again.

In contrast to the first variant, however, here the electric motor 14 which drives the fan 13 is arranged outside the housing 1 on a housing wall 3 and is connected to the fan 13 by means of a coupling 15, or a clutch, and a drive shaft which is guided through the housing wall 3.

This second variant has the advantage that the housing 1 does not have to be opened when replacing the electric motor 14.

The invention claimed is:
1. An arrangement, comprising:
a housing having a housing base;
a power electronics circuit disposed on said housing base in said housing;
said housing base being formed with a cavity and with inlet and outlet connections fluidically connecting said cavity in said housing base with a housing exterior, for supplying a cooling liquid to said cavity and discharging the cooling liquid from said cavity, said cavity being disposed to cool said power electronics circuit from below and to withdraw heat from said power electronics circuit;
cooling coils through which the cooling liquid can flow being formed on a side of said housing base that is averted from said cavity, said cooling coils being fluidically connected to said cavity to enable the cooling liquid to flow from said cavity through said cooling coils; and
a fan, to be driven by an electric motor, arranged in said housing and disposed to generate an air flow that flows in direct contact over said cooling coils, and thus draws heat from said power electronics circuit,
said cooling coils being formed by an undulated pipe disposed to be exposed in the air flow generated by said fan,
said undulated pipe projecting vertically from said base and conducting the cooling liquid of said cavity; and
said cooling coils being located between said fan and the components of said power electronics circuit.

* * * * *